(12) United States Patent
Kaneko

(10) Patent No.: US 12,178,109 B2
(45) Date of Patent: Dec. 24, 2024

(54) DISPLAY DEVICE

(71) Applicant: SHARP KABUSHIKI KAISHA, Sakai (JP)

(72) Inventor: Toshihiro Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 518 days.

(21) Appl. No.: 17/418,052

(22) PCT Filed: Feb. 4, 2019

(86) PCT No.: PCT/JP2019/003886
§ 371 (c)(1),
(2) Date: Jun. 24, 2021

(87) PCT Pub. No.: WO2020/161774
PCT Pub. Date: Aug. 13, 2020

(65) Prior Publication Data
US 2022/0093703 A1 Mar. 24, 2022

(51) Int. Cl.
*H10K 59/88* (2023.01)
*H10K 50/816* (2023.01)
*H10K 50/82* (2023.01)
*H10K 59/124* (2023.01)
*H10K 59/131* (2023.01)
*H10K 59/35* (2023.01)

(52) U.S. Cl.
CPC .......... *H10K 59/88* (2023.02); *H10K 59/131* (2023.02); *H10K 50/816* (2023.02); *H10K 50/82* (2023.02); *H10K 59/124* (2023.02); *H10K 59/35* (2023.02)

(58) Field of Classification Search
CPC .......... H10K 59/88; H10K 59/00–1315; H01L 22/00; H05B 33/00–28
See application file for complete search history.

(56) References Cited

U.S. PATENT DOCUMENTS

2011/0133636 A1* 6/2011 Matsuo ................. H10K 71/00
313/504
2020/0373367 A1* 11/2020 Okabe .................. F16K 31/002

FOREIGN PATENT DOCUMENTS

| JP | 11311611 A | * | 11/1999 |
| JP | H11311611 A | * | 11/1999 |
| JP | 2018003356 A | * | 1/2018 |
| JP | 2018098070 A | * | 6/2018 |

* cited by examiner

*Primary Examiner* — Syed I Gheyas
*Assistant Examiner* — Casey Paul Boatman
(74) *Attorney, Agent, or Firm* — ScienBiziP, P.C.

(57) ABSTRACT

A display device includes: a display element provided to a display region; an analysis element provided to a frame region disposed around the display region; and a sealing layer sealing the display element and the analysis element. The display element includes: a TFT layer including a resin film; and a light-emitting element layer including a first electrode, a functional layer, and a second electrode. The analysis element includes: a first metal film formed on the resin film; an analysis layer formed on the first metal film; a second metal film formed to cover at least a portion of an edge of the analysis layer, and electrically connected to the first metal film; and a ground wire electrically connected through the first metal film to the second metal film.

20 Claims, 13 Drawing Sheets

(a)

(b)

(a)

TOF-SIMS ANALYSIS RESULT OF
NOVEL MULTILAYER STRUCTURE OF TEG PORTION (b)

TOF-SIMS ANALYSIS RESULT OF
CONVENTIONAL MULTILAYER STRUCTURE OF TEG PORTION

TOF-SIMS ANALYSIS RESULT OF
NOVEL MULTILAYER STRUCTURE OF TEG PORTION

TOF-SIMS ANALYSIS RESULT OF
CONVENTIONAL MULTILAYER STRUCTURE OF TEG PORTION (a) TOF-SIMS ANALYSIS RESULT OF NOVEL MULTILAYER STRUCTURE OF TEG PORTION (b) TOF-SIMS ANALYSIS RESULT OF CONVENTIONAL MULTILAYER STRUCTURE OF TEG PORTION

DISPLAY DEVICE

TECHNICAL FIELD

The disclosure relates to a display device.

BACKGROUND ART

Patent Document 1 discloses a configuration of an inspection element (an analysis element) including an analysis layer and provided to a frame region. The frame region is disposed around a display region provided with a display element. The analysis layer of this inspection element includes a light-emitting layer. When emitting light, the light-emitting layer, formed in a functional layer (the analysis layer) of the display element, is checked from outside how it emits light and inspected for deterioration.

CITATION LIST

Patent Literature

[Patent Document 1] Japanese Unexamined Patent Application Publication No. 2018-098070 (published on Jun. 21, 2018)

SUMMARY OF INVENTION

Technical Problems

As to the above display device, use of, for example, the secondary ion mass spectrometry (SIMS) is known to inspect for deterioration of the analysis layer formed of a plurality of organic layers including the light-emitting layer.

If SIMS, which involves emitting ions, is applied to a known display device, charges are gradually accumulated in the analysis layer. Because of the accumulated charges, the deterioration inspection might not be conducted appropriately. In particular, if the display device is used for, for example, a mobile device and includes a small display element (a display pixel), the analysis element (the analysis layer) is also small. Hence, the charges are accumulated in the analysis layer for a short time, making it difficult to appropriately conduct the deterioration inspection.

In view of the above problems, the disclosure is intended to provide a display device to be appropriately and readily inspected for deterioration even if the display element is downsized.

Solution to Problems

A display device according to an aspect of the disclosure includes: a display element provided to a display region; an analysis element provided to a frame region disposed around the display region; and a sealing layer sealing the display element and the analysis element. The display element includes: a TFT layer including a resin film; and a light-emitting element layer including a first electrode, a functional layer, and a second electrode. The analysis element includes: a first metal film formed on the resin film; an analysis layer formed on the first metal film; a second metal film formed to cover at least a portion of an edge of the analysis layer, and electrically connected to the first metal film; and a ground wire electrically connected through the first metal film to the second metal film.

Advantageous Effects of Disclosure

An aspect of the disclosure makes it possible to appropriately and readily conduct an inspection for deterioration even if the display element is downsized.

DESCRIPTION OF EMBODIMENT

In the description below, the term "same layer" means that constituent features are formed in the same process (in the same film deposition process). The term "lower layer (or layer below)" means that a constituent feature is formed in a previous process before a comparative layer is formed. The term "upper layer (or layer above)" means that a constituent feature is formed in a successive process after a comparative layer is formed.

Figure 1:
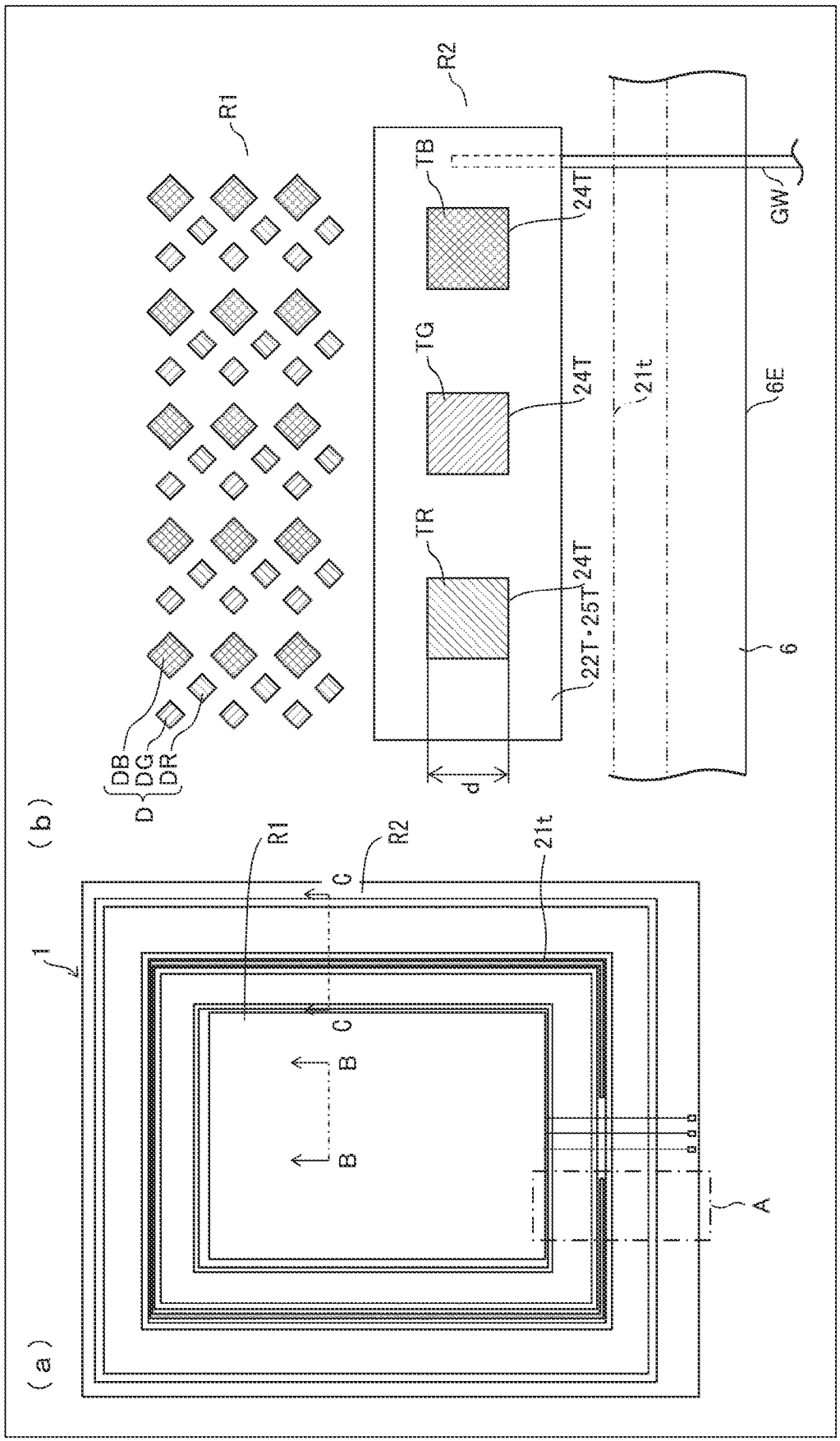
FIG. 1 An illustration (a) of FIG. 1 is a plan view schematically showing a display device according to an embodiment, and an illustration (b) is an enlarged view of a portion A in the illustration (a).
Figure 2:
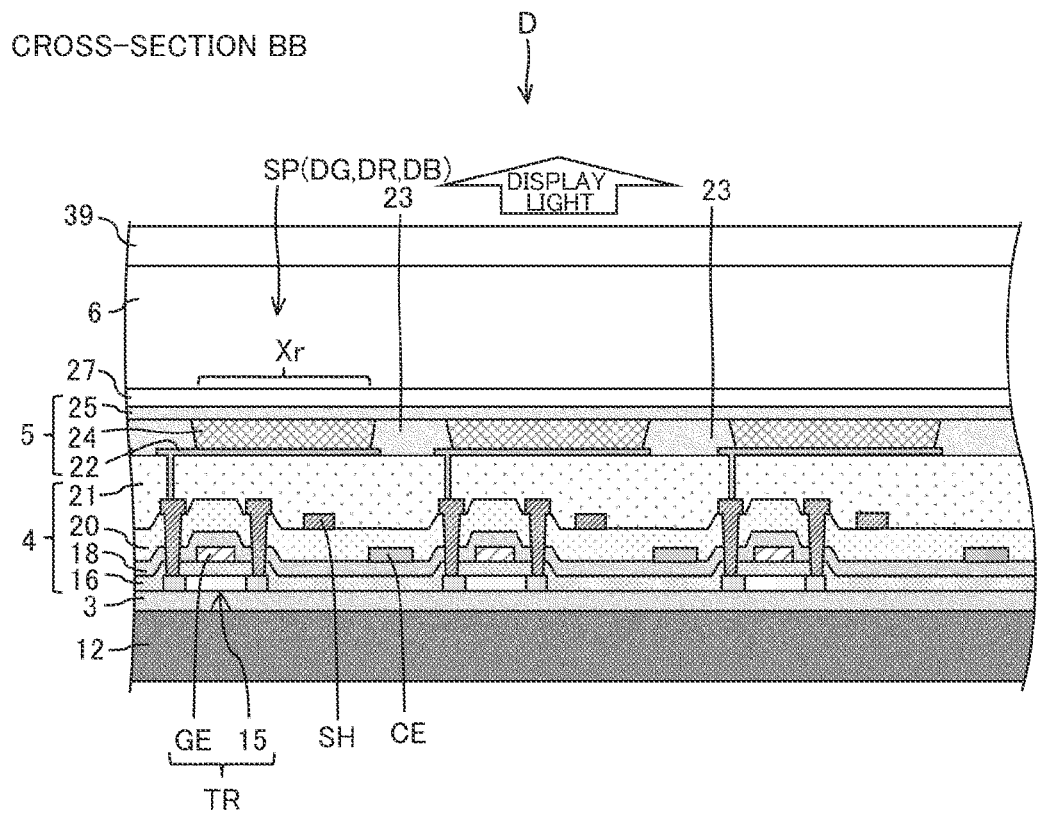
FIG. 2 is a cross-sectional view taken along a cross-section BB, shown in the illustration (a) of FIG. 1, of a display element formed in a display region of the display device

An illustration (a) of FIG. 1 is a plan view schematically showing a display device 1 according to an embodiment, and an illustration (b) is an enlarged view of a portion A in the illustration (a). FIG. 2 is a cross-sectional view taken along a cross-section BB, shown in the illustration (a) of 1, of a display element 1 formed in a display region R1 of the display device 1.

The display device 1 is a small panel to be used for such a mobile appliance as a smartphone. The display device 1 includes: a display region R1 provided with a plurality of display elements D (equivalent to a "display element" in claims) formed in a matrix; and a frame region R2 disposed around the display region R1 and provided with an analysis pixel T (equivalent to an "analysis element" of claims). The analysis pixel T is disposed closer to a terminal unit disposed in a portion of the frame region R2.

Each of the display pixels D includes: a sub-pixel DR that glows red; a sub-pixel DG that glows green; and a sub-pixel DB that glows blue. The analysis pixel T includes: an analysis sub-pixel TR corresponding to the sub-pixel DR; an analysis sub-pixel TG corresponding to the sub-pixel DG; and an analysis-sub-pixel TB corresponding to the sub-pixel DB.

When observed from a direction perpendicular to the display region R1, the analysis sub-pixel TR is larger than the sub-pixel DR, the analysis sub-pixel TG is larger than the sub-pixel DG, and the analysis sub-pixel TB is larger than the sub-pixel DB. When observed from the perpendicular direction, each of the analysis sub-pixels TR, TG, and TB is shaped into a square a side of which has a length "d" of 50 μm or longer.

The sub-pixel DR and the analysis sub-pixel TR are different in size in plan view but the same in structure. The sub-pixel DG and the analysis sub-pixel TG are also different in size in plan view but the same in structure. Moreover, the sub-pixel DB and the analysis sub-pixel TB are also different in size in plan view but the same in structure.

A base material 12 may be either a glass substrate, or a flexible substrate including a resin film such as polyimide. The flexible substrate may include: two resin films; and an inorganic insulating film sandwiched between the two resin films. A film made of, for example, polyethylene terephthalate may be attached to a lower surface of the base material 12. When the base material 12 is a flexible substrate, the display device 1 can be formed to be flexible.

A barrier layer 3 prevents such foreign objects as water and oxygen from reaching a thin-film transistor (TFT) layer 4 and a light-emitting element layer 5. An example of the barrier layer 3 includes a silicon oxide film, a silicon nitride film, or a silicon oxide nitride film formed by the chemical-vapor deposition (CVD), or a multilayer film including those films.

As illustrated in FIG. 2, the TFT layer 4 includes: a first metal layer (including a gate electrode GE) above the barrier layer 3; an inorganic insulating film 16 (a gate insulating film) above the first metal layer; a semiconductor layer (including a semiconductor film 15) below the organic insulating film 16; an inorganic insulating film 18 above the semiconductor layer; a second metal layer (including a capacitive electrode CE) above the inorganic insulating film 18; an inorganic insulating film 20 above the second metal layer; a third metal layer (including a source wire SH) above the inorganic insulating film 20; and a planarization film 21 (a resin film) above the third metal layer.

The semiconductor layer is formed of, for example, amorphous silicon, low-temperature polysilicon (LIPS), or an oxide semiconductor. A thin-film transistor (TFT) TR is formed to include the gate electrode GE and the semiconductor film 15. In FIG. 2, the TFT TR is a bottom-gate TFT. Alternatively, the TFT TR may be a top-gate TFT.

In the display pixel D, each of the sub-pixels SP (DC, DR, and DB) is provided with: a light-emitting element Xr; and a control circuit for the light-emitting element Xr. The TFT layer 4 includes: the control circuit; and a wire connecting to the control circuit. The control circuit includes: a drive transistor to control a current of the light-emitting element Xr; a write transistor electrically connecting to a scanning signal line; and a light-emission control transistor electrically connecting to a light-emission control line.

The first metal layer, the second metal layer, and the third metal layer are each formed of a metal monolayer film or a metal multilayer film including at least one of, for example, aluminum, tungsten, molybdenum, tantalum, chromium, titanium, and copper.

The inorganic insulating films 16, 18, and 20 can be, for example, a silicon oxide ($SiO_x$) film, or a silicon nitride ($SiN_x$) film formed by the CVD, or a multilayer film including these films. The planarization film 21 may be made of an applicable organic material such as polyimide and acrylic resin.

The light-emitting element layer 5 includes: a first electrode (an anode) 22 above the planarization film 21; an edge cover film 23 (an edge cover) covering an edge of the first electrode 22 and providing insulation; an EL layer 24 (a functional layer) above the edge cover film 23; a second electrode (a cathode) 25 above the EL layer 24; and a Cap layer 27 above the second electrode 25. The edge cover film 23 is formed of, for example, an organic material such as polyimide and acrylic resin. The organic material is applied to the edge of the first electrode 22, and then patterned by photolithography to form the edge cover film 23.

The light-emitting element layer 5 includes the light-emitting element for including a plurality of light-emitting elements Xr. Each of the light-emitting elements Xr includes: the first electrode 22 shaped into an island; the EL layer 24 (including a light-emitting layer) shaped into an island; and the second electrode 25. The second electrode 25 is a monolithic common electrode formed in common among the light-emitting elements Xr.

Each light-emitting element Xr may be, for example, an organic light-emitting diode (OLED) including an organic layer as the light-emitting layer, or a quantum dot light-emitting-diode (QLED) including a quantum-dot layer as the light-emitting layer.

Figure 3:
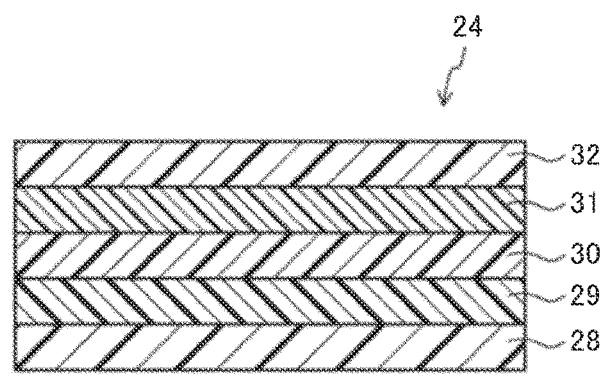
FIG. 3 is an enlarged cross-sectional view of an electroluminescence (EL) layer illustrated in FIG.

FIG. 3 is an enlarged cross-sectional view of the EL layer 24 illustrated in FIG. 2. The EL layer 24 includes, for example, a hole-injection layer 28, a hole-transport layer 29, a light-emitting layer 30, an electron-transport layer 31, and an electron-injection layer 32 stacked on top of another in the stated order from below. The light-emitting layer 30 is shaped into an island, and formed in an opening of the edge cover film 23 (for each sub pixel). The other layers are shaped into islands or into a monolithic form Note that, the EL layer 24 may omit one or more of the hole-injection layer 28, the hole-transport layer 29, the electron-transport layer 31, and the electron-injection layer 32. For example, the EL layer 24 may include: the hole-transport layer 29; the light-emitting layer 30; and the electron-transport layer 31, and the electron-transport layer 31 may be a common layer provided in common among the light-emitting elements Xr.

When the organic layer (the light-emitting layer) of the OLED is vapor-deposited, a fine metal mask (FMM) is used. The FMM is a sheet including many openings. Organic material passing through one opening forms an organic layer (corresponding to one sub-pixel) shaped into an island.

The quantum-dot layer (the light-emitting layer) of the QLED is formed of, for example, a solvent into which quantum dots are dispersed. The solvent is applied and then patterned by photolithography to form the quantum-dot layer (corresponding to one sub-pixel) shaped into an island.

The first electrode 22 (the anode) is, for example, a light-reflective multilayer formed of indium tin oxide (ITO) and silver (Ag), or of ITO and an alloy including Ag. The second electrode 25 (the cathode) is a light-transparent thin film formed of, for example, an Mg Ag alloy.

If the light-emitting element Xr is the OLED, holes and electrons recombine together in the tight-emitting layer by a drive current between the first electrode 22 and the second electrode 25, which forms an exciton. While the exciton transforms to the ground state, light is emitted. Because the second electrode 25 is highly transparent to light and the first electrode 22 is light-reflective, the light emitted from the EL layer 24 travels upward. This is how the light-emitting element layer 5 is of a top emission type.

If the light-emitting element Xr is the QLED, holes and electrons recombine together in the light-emitting layer by a drive current between the first electrode 22 and the second electrode 25, which forms an exciton. While the exciton transforms from the conduction band level to the valence band level of the quantum dots, light (fluorescence) is emitted.

The light-emitting element layer 5 may include a light-emitting element (e.g. an inorganic light-emitting diode) other than the MED and the QLED.

The sealing layer 6 is a light-transparent barrier layer including, for example, an inorganic insulating film and an organic insulating film. The sealing layer 6 prevents such foreign objects as water and oxygen from penetrating into the light-emitting element layer 5.

The functional film 39 has at least one of such functions as optical compensation, touch sensing, and protection.

Figure 4:
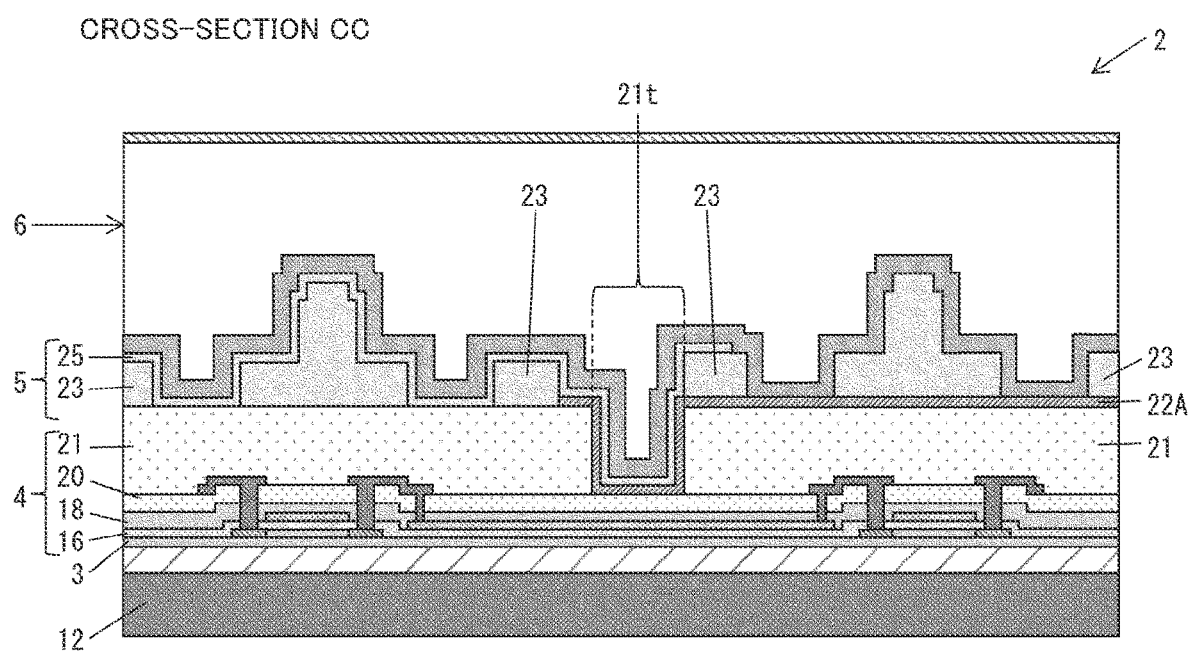
FIG. 4 is a cross-sectional view of a frame region of the display device, the cross-sectional view being taken along a cross-section CC shown in the illustration (a) of FIG. 1.

FIG. 4 is a cross-sectional view of the frame region R2 of the display device 1. The cross-sectional view is taken along a cross-section CC shown in the illustration (a) of FIG. 1. Identical reference signs are used to denote identical or substantially identical constituent features between FIG. 4 and FIGS. 1 to 3. Such identical constituent features will not be repeated elaborated upon.

In the planarization film 21, a trench 21*t* is formed. As shown in plan view in the illustration (a) of FIG. 1, this trench 21*t* is provided to the frame region R2 and formed into a substantial U-shape. Connected to the trench 21*t* are the second electrode 25 and a metal film 22A, The metal film 22A is formed in the same layer, and of the same material, as the first electrode 22 is of the light-emitting element layer 5 illustrated in FIG. 2.

In the frame region R2, the analysis sub-pixels TR, TG, and TB may be positioned closer to the trench 21*t* and either toward or away from the display region R1. Preferably, as shown in the illustration (b) of FIG. 1, the analysis sub-pixels TR, TG, and TB are positioned toward the display region R1.

Figure 5:
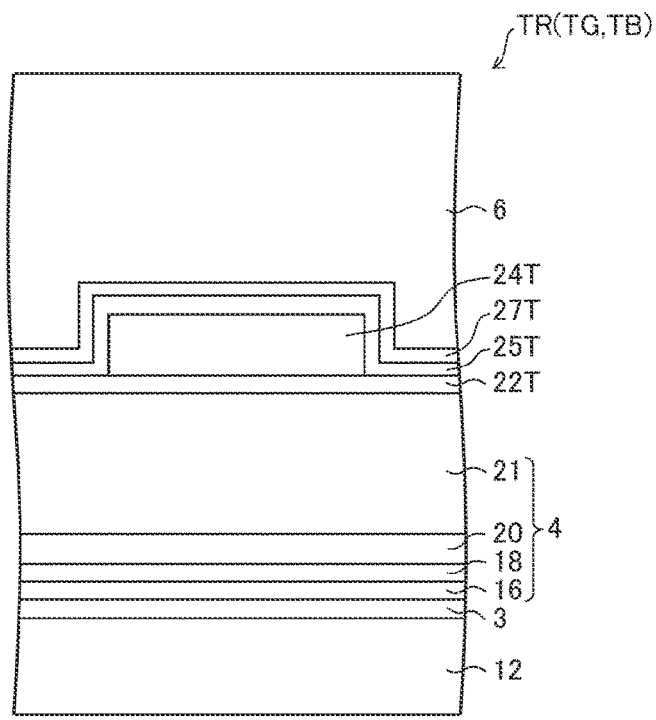
FIG. 5 An illustration (a) of FIG. 5 is a cross-sectional view of an analysis element formed in the frame region of the display device, and an illustration (b) of FIG. 5 is a cross-sectional view of the analysis element during a defect analysis.
Figure 5:
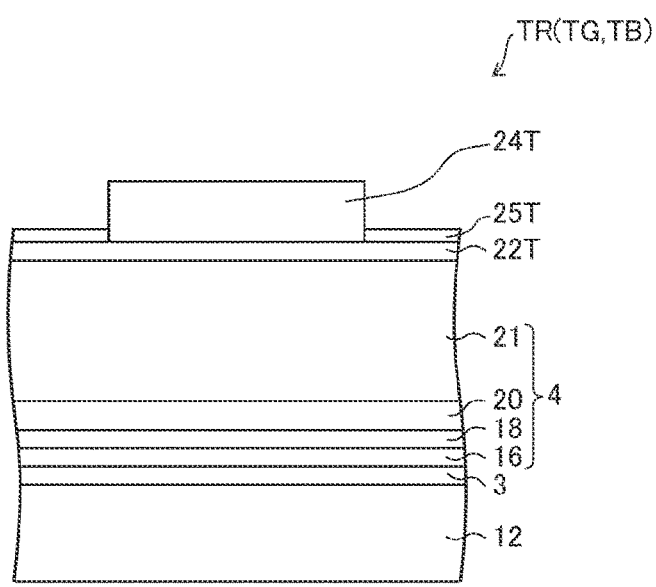

An illustration (a) of FIG. 5 is a cross-sectional view of the analysis sub-pixel TR (TG, or TB) included in the analysis pixel T formed in the frame region R2 of the display device 1. An illustration (b) of FIG. 5 is a cross-sectional view of the analysis sub-pixel TR (TG, or TB) during a defect analysis. Identical reference signs are used to denote identical or substantially identical constituent features between FIG. 5 and FIG. 2. Such identical constituent features will not be repeatedly elaborated upon.

The analysis sub-pixels TR, TG, and TB are the same in cross-sectional structure. Representing these analysis sub-pixels, described here is the cross-sectional structure of the analysis sub-pixel TR. The analysis sub-pixel TR includes: a first metal film 22T formed on the planarization film 21; an analysis EL layer 24T (an analysis layer, or an analysis light-emitting layer) formed on the first metal layer 22T; a second metal film 25T formed on the first metal film 22T to cover the analysis EL layer 24T; and a Cap film 27T formed between the second metal film 251 and the sealing layer 6.

As shown in the illustration (b) of FIG. 1, the first metal film 22T and the second metal film 25T are formed in the same size and sandwich each analysis EL layer 24T of the analysis sub-pixels TR, TG, and TB. Moreover, a ground wire GW is formed of the first metal film 22T, and lead out of the sealing layer 6 over an edge side 6E of the sealing layer 6.

The illustration (b) of FIG. 1 shows an example that the first metal film 22T is provided in common among the analysis sub-pixels TR, TG, and TB. However, the disclosure shall not be limited to such an example. For example, the first metal film 22T may be provided for each of the analysis sub-pixels TR, TG, and TB. In such a case, three ground wires GW are each provided to correspond to one of the analysis sub-pixels TR, TG, and TB.

Furthermore, in the above description, the illustration (b) of FIG. 1 shows an example that the first metal film 22T and the second metal film 25T are formed into the same shape. However, the disclosure shall not be limited to this example. The first metal film 22T and the second metal film 25T may be formed into different shapes.

Figure 6:
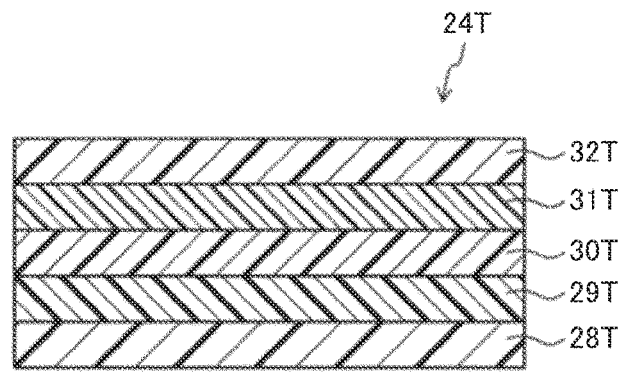
FIG. 6 is an enlarged cross-sectional view of an analysis EL layer illustrated in FIG. 5.

FIG. 6 is an enlarged cross-sectional view of the analysis EL layer 24T illustrated in FIG. 5. Similar to the EL layer 24, the analysis EL layer 241 includes, for example: an analysis hole-injection layer 28T; an analysis hole-transport layer 291; an analysis light-emitting layer 30T; an analysis electron-transport layer 31T; and an analysis electron-injection layer 32T stacked on top of another from below.

After that, as shown in the illustration (b) of FIG. 1, the ground wire GW is formed to be electrically connected through the first metal film 221 to the second metal film 25T, Preferably, the ground wire GW intersects with, and extends out of, the sealing layer 6, A trunk wire for ELVSS serving as the ground wire GW is connected to the first metal film 22T and grounded. Hence, when the analysis EL layer 24T is treated with a sputter gun 42 and a primary ion gun 43 to be described later and charges are accumulated on the surface of the analysis EL layer 24T, the trunk wire can dissipate the accumulated charges to the ground.

The analysis EL layer 241 is formed in the same layer, and of the same material, as the EL layer 24 of the sub-pixel DR is. The analysis EL layer 241 is larger in plan view than the EL layer 24. The analysis EL layer 24T includes an analysis light-emitting layer 30T corresponding to the light-emitting layer 30 of the EL layer 24. The first metal film 22T is formed in the same layer, and of the same material, as the first electrode 22 of the sub-pixel DR is. Preferably, the first metal film 22T is formed of ITO. For example, the first metal film 22T is of a three-layer multilayer structure of ITO/Ag/ITO, or ITO/AL/ITO. ITO may be replaced with IZO. The second metal film 25T is formed in the same layer, and of the same material, as the second electrode 25 is. Preferably, the second metal film 25T is formed of silver. The ground wire GW is formed in the same layer, and of the same material, as the first metal film 22T is.

The analysis sub-pixel TR is not provided with the edge cover film 23 so that the first metal film 22T is at least partially exposed.

When the analysis light-emitting layer 30T of the analysis EL layer 24T in the analysis sub-pixel TR (TG, or TB) is inspected for amount of deposition and deterioration by water and oxygen by the time-of-flight secondary ion mass spectrometry (TOE-SIMS), the sealing layer 6 is, as shown in the illustration (b) of FIG. 5, physically removed from the analysis EL layer 24T together with the Cap film 27T and portions of the second metal film 25T provided to the side faces and the upper face of the analysis EL layer 24T.

Figure 7:
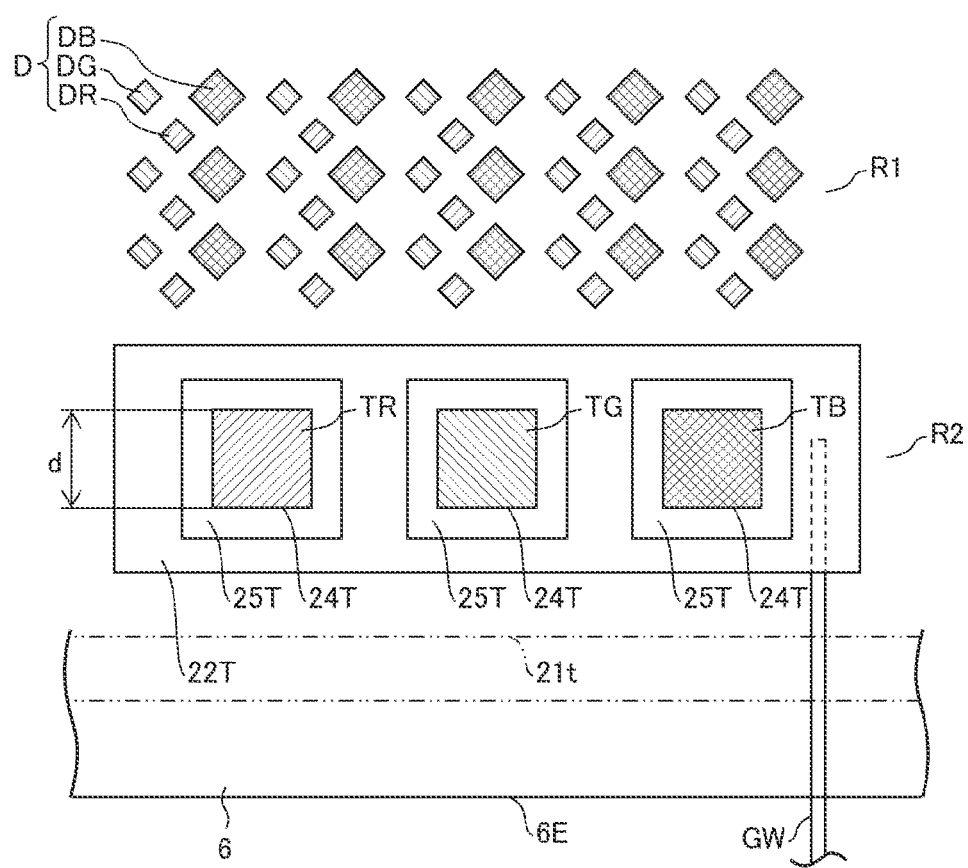
FIG. 7 is an enlarged view of the portion A in the illustration (h) of FIG. 1 with a sealing layer removed.

FIG. 7 is an enlarged view of the portion A in the illustration (b) of FIG. 1 with the sealing layer 6 removed. After the sealing layer 6 is removed, the second metal film 25T is left to surround each analysis EL layer 24T of the analysis sub-pixels TR, TG, and TB. Moreover, the ground wire GW is formed of the first metal film 22T, and lead out of the sealing layer 6 over the edge side 6E of the sealing layer 6.

In the example shown in the illustration (a) of FIG. 5, the second metal film 25T is formed to cover a whole surface of the analysis EL layer 24T. However, the disclosure shall not be limited to this example. The second metal film 25T may be formed to cover at least a peripheral edge of the analysis EL layer 24T.

Figure 8:
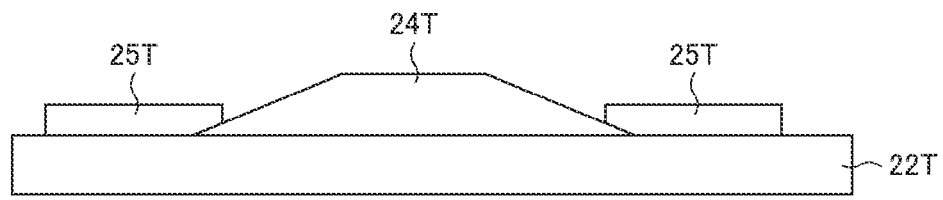
FIG. 8 is a cross-sectional view schematically illustrating an actual embodiment of the analysis EL layer provided to the analysis element.
Figure 9:
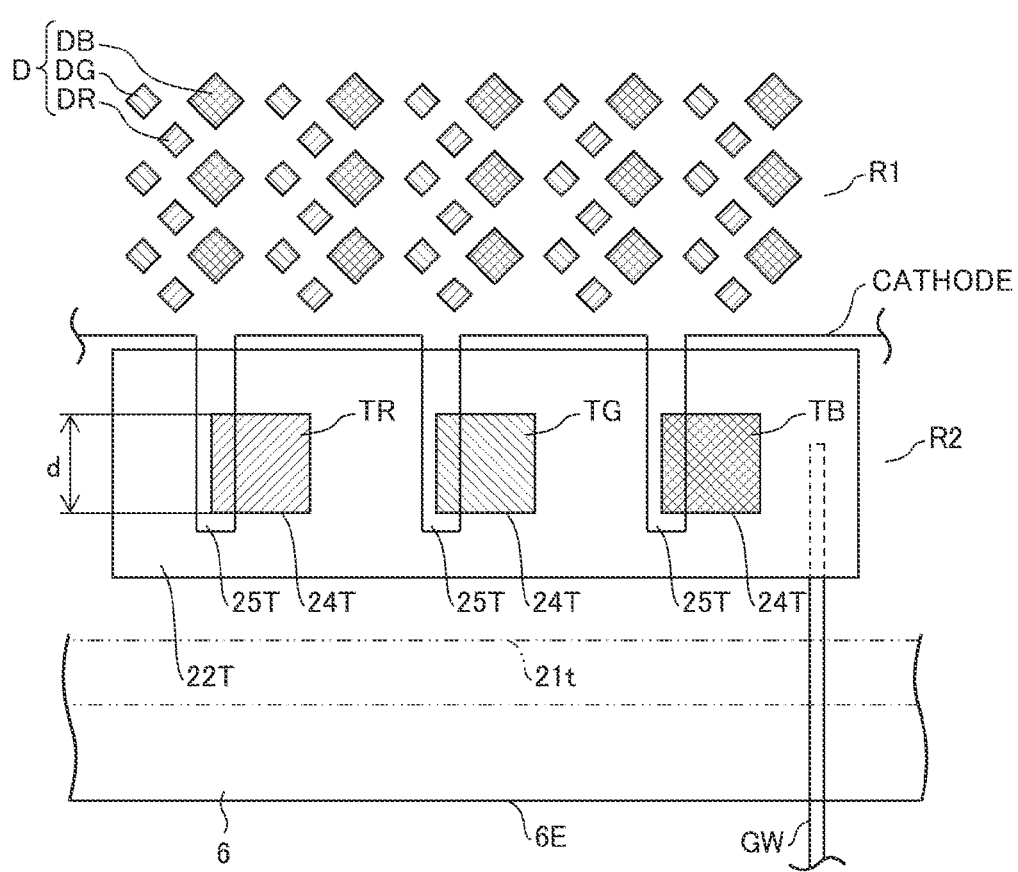
FIG. 9 is an enlarged view of a modification of the portion A in the illustration (b) of FIG. 1 with the sealing layer removed.

FIG. 8 is a cross-sectional view schematically illustrating an actual shape of the analysis EL layer 24T. The analysis EL layer 24T, formed of an organic film, has a side face actually inclined gradually as illustrated in FIG. 8. The second metal film 25T is formed to cover a peripheral edge of the analysis EL layer 24T. When such a constituent feature as the sealing layer 6 is removed from the analysis EL layer 24T, the peripheral edge of the analysis EL layer 24T is preferably sandwiched between the second metal film 25T and the first metal film 22T, FIG. 9 is an enlarged view of a modification of the portion A in the illustration (b) of FIG. 1 with the sealing layer 6 removed. The second metal film 25T is formed to cover at least a portion of the edge of the analysis layer 24T. For example, as illustrated in FIG. 9, the second metal film 25T is formed of the second electrode 25 (the cathode), and covers one of the four side edges of each analysis EL layer 24T of the analysis sub-pixels TR, TG, and TB, Moreover, the ground wire GW is formed of the first metal film 22T, and lead out of the sealing layer 6 over the edge side 6E of the sealing layer 6.

Figure 10:
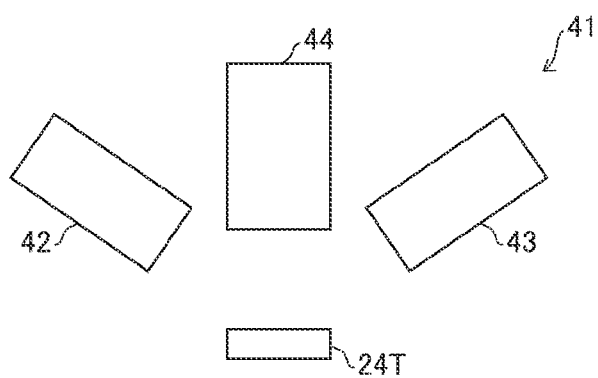
FIG. 10 is a schematic view illustrating a configuration of a time-of-flight secondary ion mass spectrometry (TOF-SIMS) analyzer analyzing the analysis element.
Figure 11:
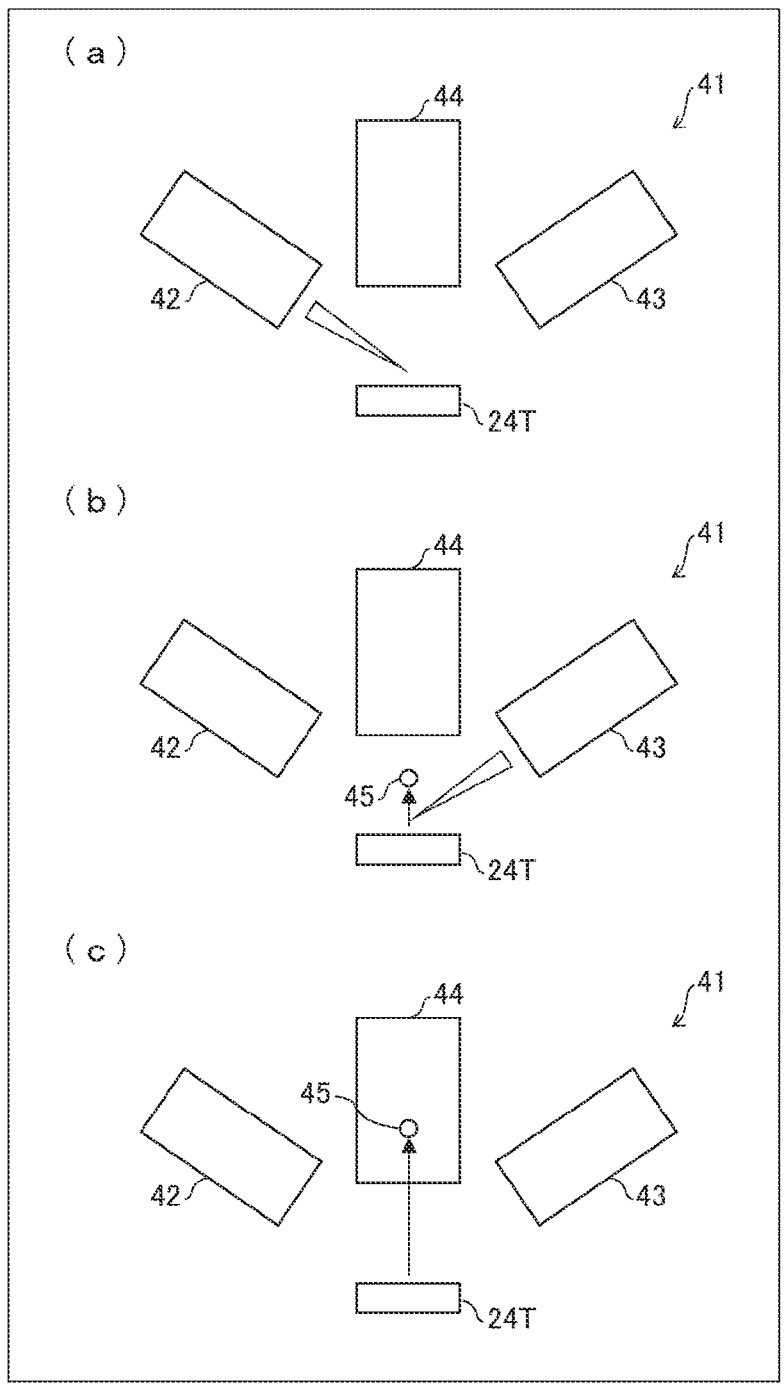
FIG. 11 illustrations (a) to (c) of FIG. 11 are schematic views showing a sequence of an analysis carried out with the TOF-SIMS analyzer.

FIG. 10 is a schematic view illustrating a configuration of a TOF-SIMS analyzer 41 analyzing the analysis EL layer 24T. Illustrations (a) to (c) of FIG. 11 are schematic views showing a sequence of an analysis carried out with the TOF-SIMS analyzer 41. The TOF-SIMS involves emitting an ion beam (primary ions) to a solid specimen, and mass-separating ions (secondary ions) released from a surface of the solid specimen utilizing a variation in time of flight of the released ions (i.e. the time of flight is in proportion to a square root of the weight of the released ions). Hence, the TOF-SIMS can highly sensitively detect information on an element or a molecular species existing in a depth of 1 nm or below the surface of the solid specimen.

The TOE-SIMS analyzer 41 includes: the sputter gun (a gas cluster ion beam or GCIB) 42 for digging the surface of the analysis EL layer 24T; the primary ion gun 43 emitting pulsed primary ions to the surface of the analysis EL layer 24T; and a detector 44 catching secondary ions 45 ejected, from the surface of the analysis EL layer 24T, by the emitted pulsed primary ions.

This TOF-SIMS analyzer 41 has specifications below:
TOF-SIMS Analyzer: Manufactured by IONTOF, TOF-SIMS V,
Primary ion species: $Bi_3^{++}$,
Primary accelerating voltage: 30 kV,
Etching ions: Ar-GLIB (gas cluster ion beam)
Etching ions accelerating voltage: 2 kV, and
Ar cluster size: approximately 1,500

The TOF-SIMS analyzer 41 of the above configuration analyzes the analysis EL layer 24T as described below.

First, as shown in the illustrations (a) and (b) of FIG. 5, the sealing layer 6 is physically removed from the analysis EL layer 24T together with the Cap film 27T and portions of the second metal film 25T provided to the side faces and the upper face of the analysis EL layer 24T. After that, as illustrated in FIG. 10, the analysis EL layer 24T with such constituent features as the sealing layer 6 removed is set up on the TOF-SIMS analyzer 41.

Next, as shown in the illustration (a) of FIG. 11, the surface of the analysis EL layer 24T is treated with the sputter gun 42. After that, as shown in the illustration (b) of FIG. 11, the primary ion gun 43 emits pulsed primary ions to the surface of the analysis EL layer 24T so that the pulsed primary ions sputter the surface in trace amount. After that, as shown in the illustration (c) FIG. 11, the emitted primary ions eject the secondary ions 45 from the surface of the analysis EL layer 24T. The detector 44 catches the ejected secondary ions 45.

Next, the process of the illustrations (a) to (c) is repeated. On the basis of the spectrum analysis according to mass, a composition profile is obtained for each of the layers of the analysis EL layer 241. Each obtained composition profile is several nanometers long along the depth of the analysis EL layer 24T.

Preferably, the analysis EL layer 24T is formed on a flat place. The flat place can keep the surface of the analysis EL layer 24T from being angled. As a result, when the TOF-SIMS analyzer 41 analyses the analysis EL layer 24T, the sputter gun 42 can be kept from digging a wrong layer on the surface of the analysis EL layer 24T, making it possible to conduct the analysis appropriately and readily.

Figure 12:
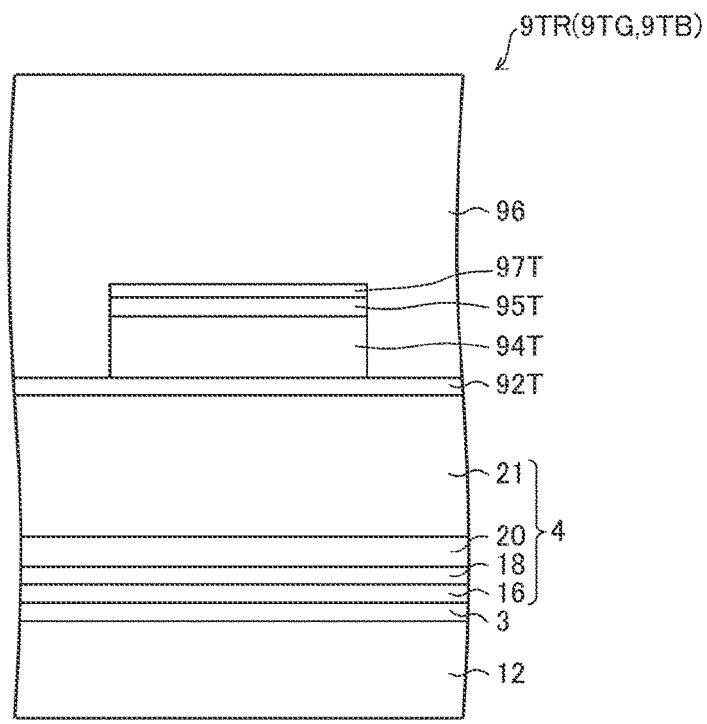
FIG. 12 An illustration (a) of FIG. 12 is a cross-sectional view of an analysis element according to a comparative example, and an illustration (b) of FIG. 12 is a cross-sectional view of the analysis element during a defect analysis.
Figure 12:
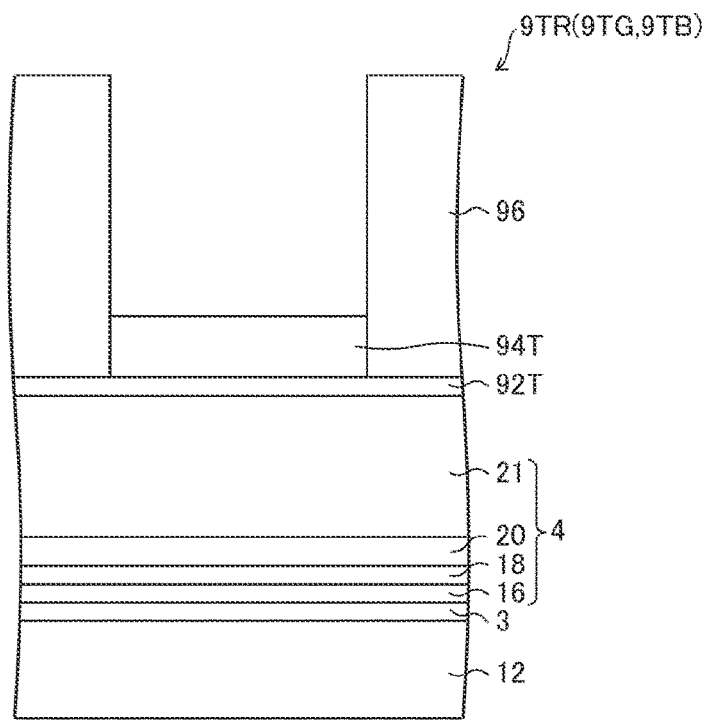

An illustration (a) of FIG. 12 is a cross-sectional view of an analysis sub-pixel 9TR (9TG, or 9TB) according to a comparative example, and an illustration (h) of FIG. 12 is a cross-sectional view of the analysis sub-pixel 9TR (9TG, or 9TB) during a defect analysis. Identical reference signs are used to denote identical or substantially identical constituent features between FIG. 12 and FIG. 5. Such identical constituent features will not be repeatedly elaborated upon.

The analysis sub-pixel 9TR includes: a first metal film 92T formed on the planarization film 21; an analysis EL layer 941 formed on the first metal film 92T; a second metal film 95T formed on the analysis EL layer 94T; and a Cap film 97T formed between the second metal film 95T and a sealing layer 96.

When the analysis EL layer 94T of the analysis sub-pixel 9TR (910, or 9TB) has a light-emitting layer inspected for deterioration by the TOF-SIMS, the sealing layer 96 is, as shown the illustration (b) of FIG. 12, physically removed along the side faces of the analysis EL layer 24T together with the Cap film 97T and the second metal film 95I.

In this comparative example, when the analysis EL layer 94T is treated with the sputter gun 42 and the primary ion gun 43, charges are accumulated on the surface of the analysis EL layer 94T. The amount of the charges to be accumulated on the surface of the analysis EL layer 94T increases as the sputtering time proceeds. Hence, a problem of the comparative example is that, as the sputtering time proceeds, a profile of an intensity signal according to the mass-separation is disturbed. Consequently, output of the intensity signal stops.

In this embodiment, when the analysis EL layer 24T is treated with the sputter gun 42 and the primary ion gun 43, charges accumulated on the surface of the analysis EL layer 24T can be dissipated through the second metal film 25T, the first metal film 221, and the ground wire GW. Such a feature can reduce the risk that the charges are accumulated on the surface of the analysis EL layer 241 during the analysis. Hence, the feature can solve the problems of (i) the charges accumulated in a shorter period of time when an analysis element (an analysis layer) is downsized as a display element is downsized, and (ii) the resulting difficulty in appropriate inspection for deterioration. As a result, the feature makes it possible to appropriately and readily conduct an inspection for deterioration even if the display device is downsized.

Figure 13:
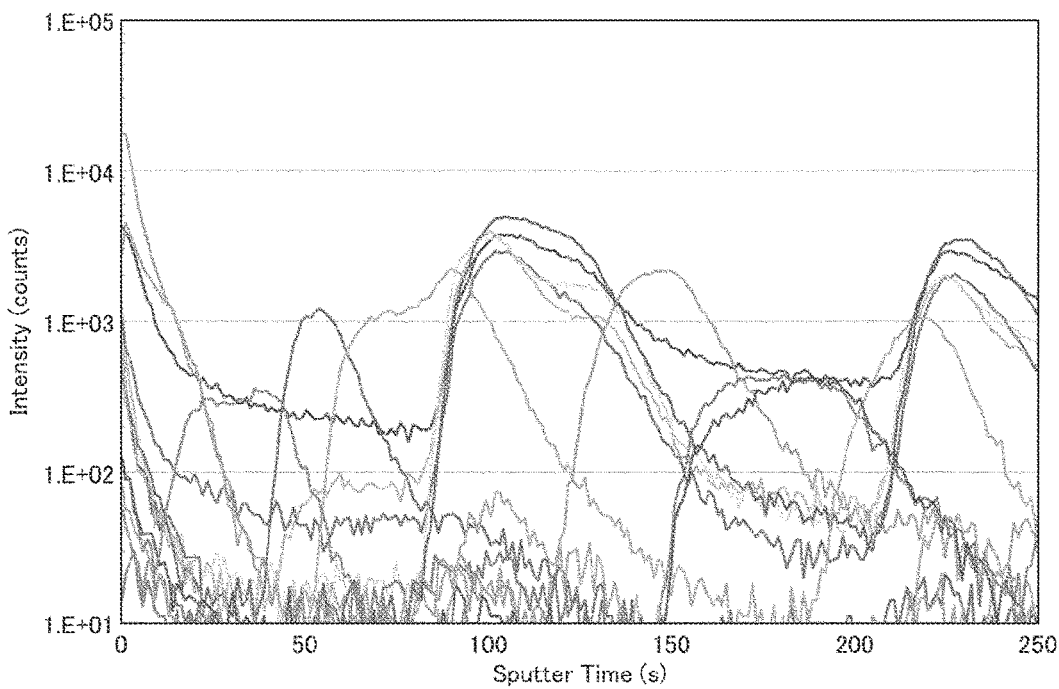
FIG. 13 An illustration (a) of FIG. 13 is a graph showing a result of the analysis of the analysis element according to the embodiment, the analysis being carried out with the TOF-SIMS analyzer, and an illustration (b) of FIG. 13 is a graph showing a result of the analysis of the analysis element according to the comparative example, the analysis being carried out with the TOF-SIMS analyzer.
Figure 13:
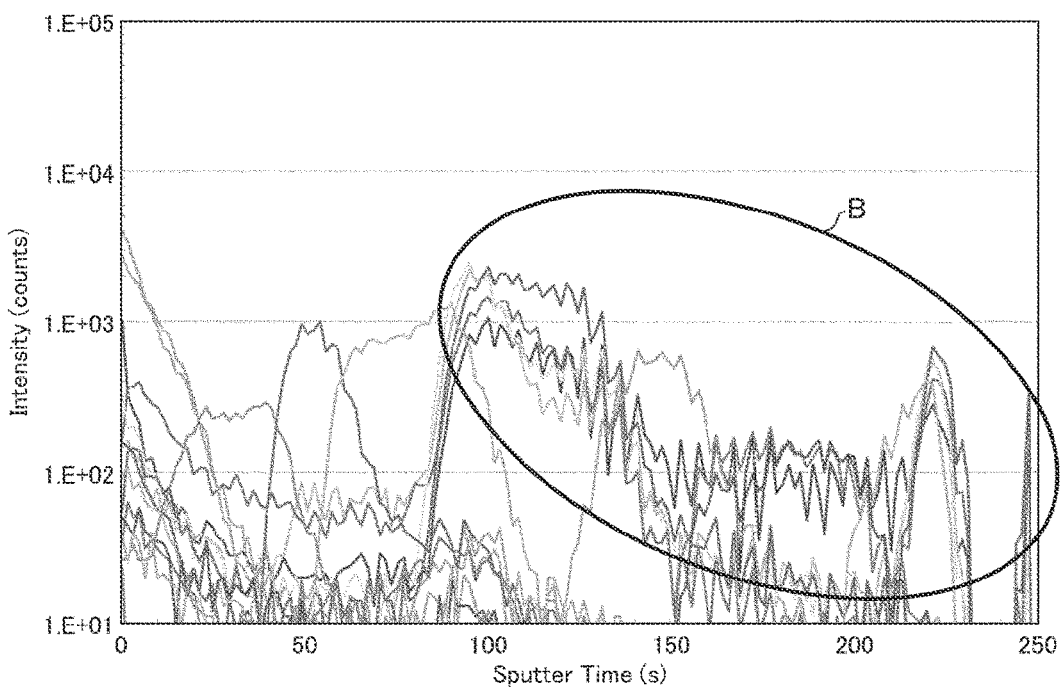

An illustration (a) of FIG. 13 is a graph showing a result of the analysis of the analysis EL layer 24T according to the embodiment. The analysis is carried out with the TOF-SIMS analyzer 41. An illustration (b) of FIG. 13 is a graph showing a result of the analysis of the analysis EL layer 94T according to the comparative example. The analysis is carried out with the TOR-SIMS analyzer 41.

As seen in an area "B" of the illustration (b) of FIG. 13, the result of the analysis of the analysis EL layer 94T according to the comparative example shows that, because of the influence of the charges to be accumulated on the surface of the analysis EL layer 94T by the treatments with the sputter gun 42 and the primary ion gun 43, the profile of the intensity signal according to the mass separation is disturbed after a sputtering time of 100 seconds has passed. Hence, the resulting profile is inappropriate.

In contrast, as seen in the illustration (a) of FIG. 13, the result of the analysis of the analysis EL layer 241 according to the this embodiment shows that, when the charges are accumulated on the surface of the analysis EL layer 24T by the treatments with the sputter gun 42 and the primary ion gun 43, the accumulated charges are dissipated through the second metal film 251, the first metal film 22T, and the ground wire. Hence, the profile of the intensity signal according to the mass separation is not disturbed, and the resulting profile is appropriate.

Figure 14:
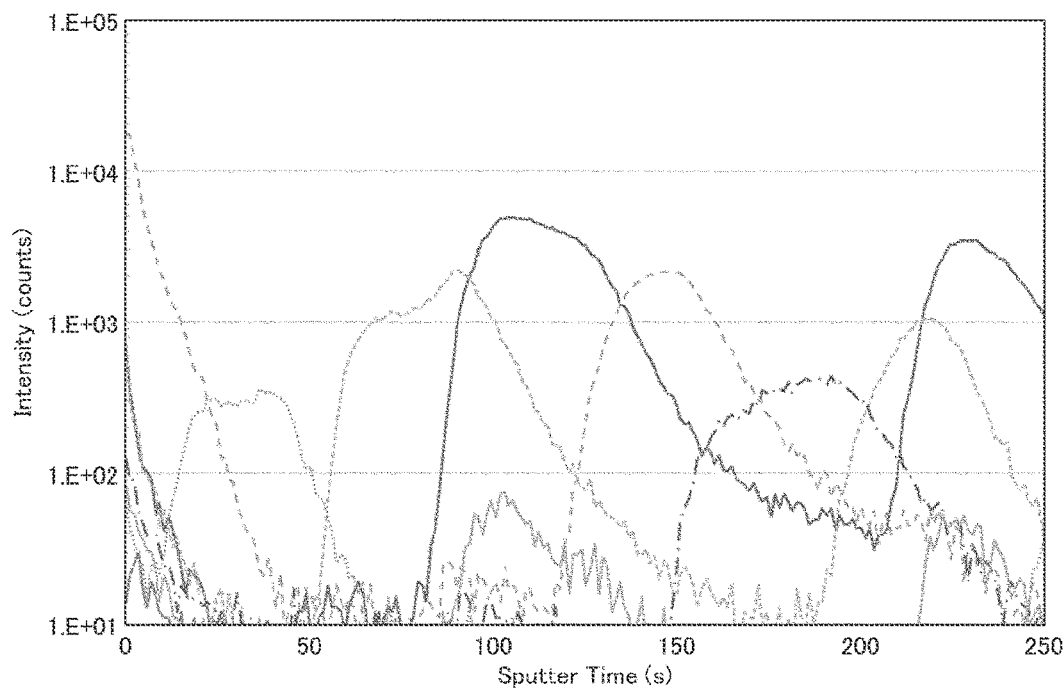
FIG. 14 An illustration (a) of FIG. 14 is a graph showing a result of another analysis of the analysis element according to the embodiment, the analysis being carried out with the TOF-SIMS analyzer, and an illustration (b) of FIG. 14 is a graph showing a result of another analysis of the analysis element according to the comparative example, the analysis being carried out with the TOF-SIMS analyzer.
Figure 14:
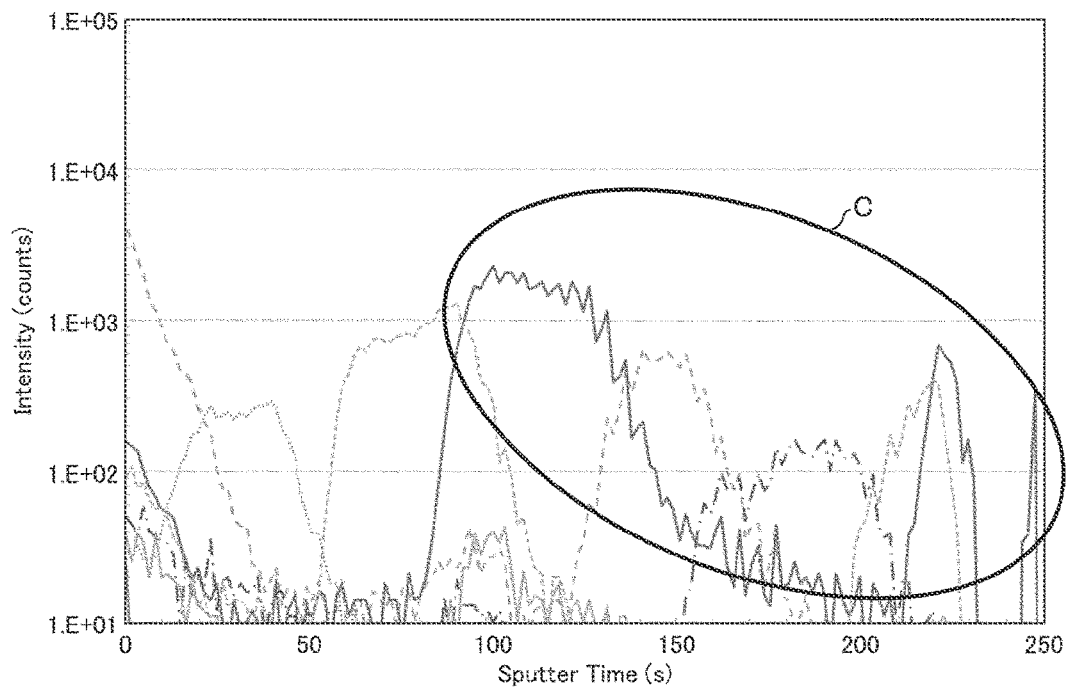

An illustration (a) of FIG. 14 is a graph showing a result of another analysis of the analysis EL layer 24T according to the embodiment. The analysis is carried out with the TOF-SIMS analyzer 41. An illustration (b) of FIG. 14 is a graph showing a result of another analysis of the analysis EL layer 94T according to the comparative example. The analysis is carried out with the TOF-SIMS analyzer 41.

As seen in an area "C" of the illustration (b) of FIG. 14, the result of the other analysis of the analysis EL layer 94T according to the comparative example shows that, because of the influence of the charges to be accumulated on the surface of the analysis EL layer 94T by the treatments with the sputter gun 42 and the primary ion gun 43, the profile of the intensity signal according to the mass separation is disturbed after a sputtering time of 100 seconds has passed. Hence, the resulting profile is inappropriate.

In contrast, as seen in the illustration (a) of FIG. 14, the result of the other analysis of the analysis EL layer 24T according to the this embodiment shows that, when the charges are accumulated on the surface of the analysis EL layer 24T by the treatments with the sputter gun 42 and the primary ion gun 43, the accumulated charges are dissipated through the second metal film 25T, the first metal film 22T, and the ground wire. Hence, the profile of the intensity signal according to the mass separation is not disturbed, and the resulting profile is appropriate.

Figure 15:
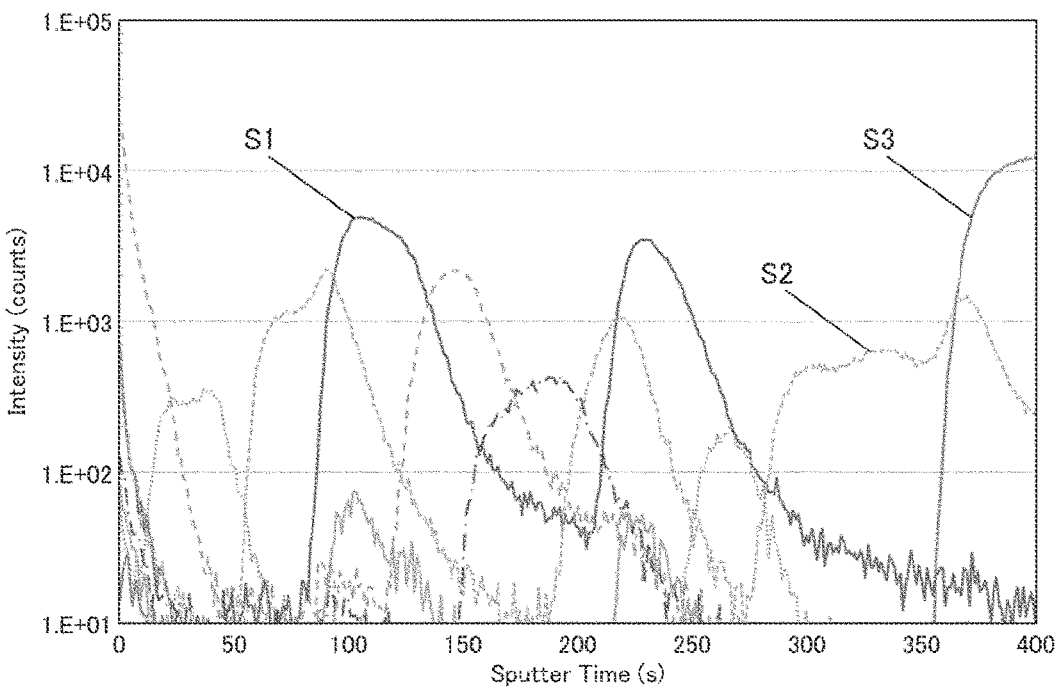
FIG. 15 An illustration (a) of FIG. 15 is a graph showing a result of still another analysis of the analysis element according to the embodiment, the analysis being carried out with the TOE-SIMS analyzer, and an illustration (b) of FIG. 15 is a graph showing a result of still another analysis of the analysis element according to the comparative example, the analysis being carried out with the TOF-SIMS analyzer.
Figure 15:
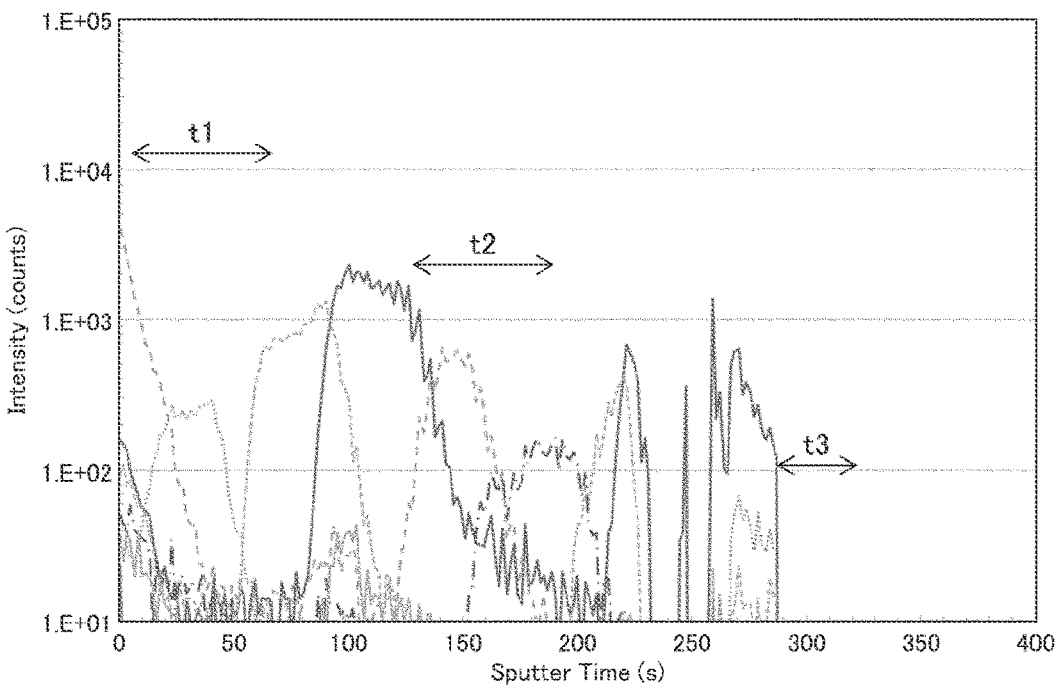
Figure 16:
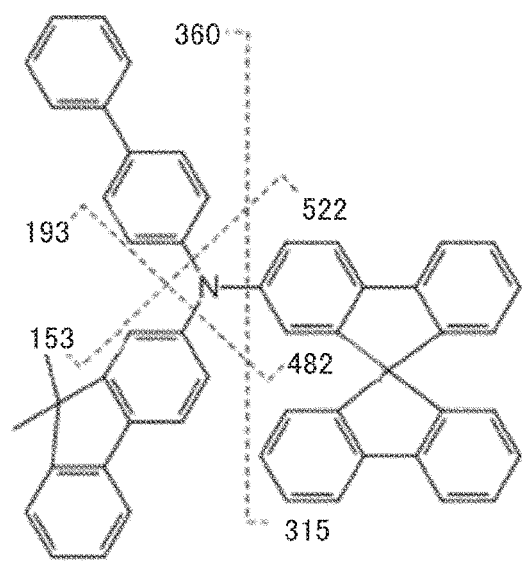
FIG. 16 is a formula of a substance included in the analysis element.
Figure 16:
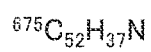

An illustration (a) of FIG. 15 is a graph showing a result of still another analysis of the analysis EL layer 24T according to the embodiment. The analysis is carried out with the TOF-SIMS analyzer 41. An illustration (b) of FIG. 15 is a graph showing a result of still another analysis of the analysis EL layer 94T according to the comparative example. The analysis is carried out with the TOF-SIMS analyzer 41. FIG. 16 is an estimated formula of an ELF substance included in the analysis EL layer 24T.

As seen in the illustration (b) of FIG. 15, the result of still the other analysis of the analysis EL layer 94T shows that, in an initial period t1, an appropriate intensity signal is measured to some degree. Because of the influence of the charges to be accumulated on the surface of the analysis EL layer 941 by the treatments with the sputter gun 42 and the primary ion gun 43, the profile of the intensity signal according to the mass separation is disturbed in a period t2 after a sputtering time of 100 seconds has passed. The output of the intensity signal completely stops in a period t3 after a sputtering time of 280 seconds has passed.

In contrast, as seen in the illustration (a) of FIG. 15, the result of still the other analysis of the analysis EL layer 24T according to the this embodiment shows that, when the charges are accumulated on the surface of the analysis EL layer 241 by the treatments with the sputter gun 42 and the primary ion gun 43, the accumulated charges are dissipated through the second metal film 25T, the first metal film 221, and the ground wire. Hence, the profile of the intensity signal according to the mass separation is not disturbed, avoiding the complete stop of outputting the intensity signal.

An intensity signal S1 in the illustration of FIG. 15 corresponds to a material (a Li quinolate complex, m/z=593) of the analysis electron-transport layer (ETL) 31T of the analysis EL layer 24T. An intensity signal S2 corresponds to a material (m/z=675, an estimated formula of $C_{52}H_{57}N$) of the analysis hole-transport layer (HTL) 29T of the analysis EL layer 24T. An intensity signal S3 corresponds to In (ITO, the anode) of the analysis EL layer 24T.

This embodiment shows an example that the TOF-SIMS analyzer 41 analyzes the analysis sub-pixel TR. However, the disclosure shall not be limited to this example. The disclosure is applicable to analysis techniques in which the charges are gradually accumulated on an object to be analyzed, such as, for example, analyses by Auger electron spectroscopy (AES) and irradiation with ions.

SUMMARY

A display device according to a first aspect includes: a display element provided to a display region; an analysis element provided to a frame region disposed around the display region; and a sealing layer sealing the display element and the analysis element. The display element includes: a TFT layer including a resin film; and a light-emitting element layer including a first electrode, a functional layer, and a second electrode. The analysis element includes: a first metal film formed on the resin film; an analysis layer formed on the first metal film; a second metal film formed to cover at least a portion of an edge of the analysis layer, and electrically connected to the first metal film; and a ground wire electrically connected through the first metal film to the second metal film.

In a second aspect, the analysis layer may be formed in the same layer, and of the same material, as the functional layer is.

In a third aspect, the functional layer may include a light-emitting layer, and >the analysis layer may include an analysis light-emitting layer corresponding to the light-emitting layer.

In a fourth aspect, the display element may include a plurality of sub-pixels having the functional layer including a plurality of the light-emitting layers each emitting light in a different color. The analysis pixel may include a plurality of analysis sub-pixels each corresponding to one of the sub-pixels, each of the analysis sub-pixels including a corresponding one of a plurality of analysis light-emitting layers each corresponding to one of the light-emitting layers.

In a fifth aspect, the analysis layer may be larger in plan view than the functional layer.

In a sixth aspect, the first metal film may be formed in the same layer, and of the same material, as the first electrode is.

In a seventh aspect, the first metal film may contain ITO.

In an eighth aspect, the second metal film may be formed in the same layer, and of the same material, as the second electrode is.

In a ninth aspect, the second metal film may contain silver,

In a tenth aspect, the light-emitting element layer may further include an edge cover covering an edge of the first electrode and having an opening to expose the first electrode. The analysis element does not have to be provided with the edge cover so that the first metal film is at least partially exposed.

In an eleventh aspect, the ground wire may be formed in the same layer, and of the same material, as the first metal film is.

In a twelfth aspect, the ground wire may intersect with, and extend out of, the sealing layer.

In a thirteenth aspect, the second metal film may be formed to cover a whole surface of the analysis layer.

In a fourteenth aspect, the display element may include a plurality of sub-pixels having the functional layer including a plurality of the light-emitting layers each emitting light in a different color. The analysis pixel may include a plurality of analysis sub-pixels each corresponding to one of the sub-pixels, each of the analysis sub-pixels including a corresponding one of a plurality of analysis light-emitting layers each corresponding to one of the light-emitting layers. The second metal film may be formed to cover one of four side edges of each of the analysis light-emitting layers of the analysis sub-pixels.

In fifteenth aspect, the second metal film may be formed in the same layer, and of the same material, as the second electrode is.

In a sixteenth aspect, the second metal film may contain silver.

The disclosure shall not be limited to the embodiment described above, and can be modified in various manners within the scope of claims. For example, the technical aspects disclosed in different embodiments are to be appropriately combined together to implement another embodiment. Such an embodiment shall be included within the technical scope of the disclosure. Moreover, the technical aspects disclosed in each embodiment may be combined to achieve a new technical feature.

The invention claimed is:

1. A display device, comprising:
a display element provided in a display region;
an analysis element provided in a frame region disposed around the display region; and
a sealing layer sealing the display element and the analysis element,
the display element including:
a thin-film transistor (TFT) layer including a resin film; and
a light-emitting element layer including a first electrode, a functional layer, and a second electrode, and
the analysis element including:
a first analysis electrode formed on the resin film;
an analysis layer formed on the first analysis electrode;
a second analysis electrode electrically connected to the first analysis electrode; and
a ground wire electrically connected through the first analysis electrode to the second analysis electrode, wherein
the analysis layer is in direct contact with the first analysis electrode and the second analysis electrode, and
the first analysis electrode and the second analysis electrode have a same fixed potential.

2. The display device according to claim 1, wherein the analysis layer is formed in the same layer, and of the same material, as the functional layer.

3. The display device according to claim 1, wherein the functional layer includes a light-emitting layer, and the analysis layer includes an analysis light-emitting layer corresponding to the light-emitting layer.

4. The display device according claim 1, wherein the display element further includes a plurality of sub-pixels having the functional layer that includes a plurality of the light-emitting layers each emitting light in a different color, and
the analysis element includes a plurality of analysis sub-pixels each corresponding to one of the plurality of sub-pixels, each of the analysis sub-pixels including a corresponding one of a plurality of analysis light-emitting layers each corresponding to one of the plurality of light-emitting layers.

5. The display device according to claim 1, wherein the analysis layer is larger in a plan-view than the functional layer.

6. The display device according to claim 1, wherein the first analysis electrode is formed in the same layer, and of the same material, as the first electrode.

7. The display device according to claim 1, wherein the first analysis electrode comprises indium tin oxide (ITO).

8. The display device according to claim 1, wherein the second analysis electrode is formed in the same layer, and of the same material, as the second electrode.

9. The display device according to claim 1, wherein the second analysis electrode comprises silver.

10. The display device according to claim 1, wherein
the light-emitting element layer further includes an edge cover covering an edge of the first electrode and having an opening to expose the first electrode, and
the analysis element is not provided with the edge cover, such that the first analysis electrode is at least partially exposed.

11. The display device according to claim 1, wherein
the ground wire is formed in the same layer, and of the same material, as the first analysis electrode.

12. The display device according to claim 1, wherein
the ground wire intersects with and extends out of the sealing layer.

13. The display device according to claim 1, wherein
the second analysis electrode is formed to cover a whole surface of the analysis layer.

14. The display device according to claim 1, wherein
the display element further includes a plurality of sub-pixels having the functional layer that includes a plurality of the light-emitting layers each emitting light in a different color,
the analysis element includes a plurality of analysis sub-pixels each corresponding to one of the plurality of sub-pixels, each of the analysis sub-pixels including a corresponding one of a plurality of analysis light-emitting layers each corresponding to one of the plurality of light-emitting layers, and
the second analysis electrode covers at least one of four side edges of a top or bottom surface of the analysis light-emitting layers of the analysis sub-pixels from a plan-view.

15. The display device according to claim 1, wherein
the second analysis electrode is formed in the same layer, and of the same material, as the second electrode.

16. The display device according to claim 1, wherein
the second analysis electrode comprises silver.

17. The display device according to claim 1, wherein
the second analysis electrode is formed to cover at least a portion of an edge of the analysis layer.

18. The display device according to claim 17, wherein
the portion of the edge of the analysis layer comprises a front surface of the analysis layer.

19. The display device according to claim 17, wherein
the second analysis electrode has an aperture that exposes the portion of the edge of the analysis layer.

20. The display device according to claim 1, wherein
the first analysis electrode and the second analysis electrode are grounded.

* * * * *